United States Patent [19]

Tepman

[11] Patent Number: 5,320,728
[45] Date of Patent: Jun. 14, 1994

[54] PLANAR MAGNETRON SPUTTERING SOURCE PRODUCING IMPROVED COATING THICKNESS UNIFORMITY, STEP COVERAGE AND STEP COVERAGE UNIFORMITY

[75] Inventor: Avi Tepman, Cupertino, Calif.

[73] Assignee: Applied Materials, Inc., Santa Clara, Calif.

[21] Appl. No.: 23,472

[22] Filed: Feb. 25, 1993

Related U.S. Application Data

[63] Continuation of Ser. No. 928,682, Aug. 11, 1992, abandoned, which is a continuation of Ser. No. 747,392, Aug. 15, 1991, abandoned, which is a continuation of Ser. No. 502,391, Mar. 30, 1990, abandoned.

[51] Int. Cl.⁵ .............................................. C23C 14/35
[52] U.S. Cl. .............................. 204/192.12; 204/298.2
[58] Field of Search ........................ 204/192.12, 298.2

[56] References Cited

U.S. PATENT DOCUMENTS

| | | | |
|---|---|---|---|
| 4,444,643 | 2/1984 | Garrett | 204/298.2 |
| 4,714,536 | 12/1987 | Freeman et al. | 204/298.2 |
| 4,746,417 | 5/1988 | Ferenbach et al. | 204/298.2 |
| 4,872,964 | 10/1989 | Suzuki et al. | 204/298.2 |

FOREIGN PATENT DOCUMENTS

| | | | |
|---|---|---|---|
| 1239115 | 7/1988 | Canada | 204/298.2 |
| 0211412 | 2/1987 | European Pat. Off. | 204/298.2 |
| 0248244 | 12/1987 | European Pat. Off. | 204/298.2 |
| 0365249 | 4/1990 | European Pat. Off. | 204/298.2 |
| 2707144 | 2/1977 | Fed. Rep. of Germany | 204/298.2 |

*Primary Examiner*—Aaron Weisstuch
*Attorney, Agent, or Firm*—Birgit E. Morris; Noel F. Heal

[57] ABSTRACT

A planar magnetron sputtering source having a pair of pole pieces configured to produce a uniform coating, excellent step coverage and excellent step coverage uniformity of a wafer. Between the two pole pieces is a gap within which the magnetic field and electric field produce an electron trap. The shape of the gap produces a depth of sputter profile in the target that results in the uniform coating, excellent step coverage and excellent step coverage uniformity.

15 Claims, 7 Drawing Sheets

PLANAR MAGNETRON SPUTTERING SOURCE PRODUCING IMPROVED COATING THICKNESS UNIFORMITY, STEP COVERAGE AND STEP COVERAGE UNIFORMITY

This is a continuation of application Ser. No. 07/928,682, filed Aug. 11, 1992, now abandoned which is a continuation of application Ser. No. 07/747,392, filed Aug. 15, 1991, now abandoned which is a continuation of application Ser. No. 07/502,391, filed Mar. 30, 1990 now abandoned.

BACKGROUND OF THE INVENTION

This invention relates in general to sputtering deposition and relates more particularly to the problems of thickness uniformity and step coverage of coats produced by planar magnetron sputtering.

In a sputtering device, a target is subjected to bombardment by high energy ions to dislodge and eject material from the target onto a workpiece, such as a semiconductor wafer. In general, the target and wafer are placed into a vacuum chamber that is evacuated to a pressure typically $5 \cdot 10^{-4}$ Torr and below. In physical sputtering, the bombarding particles are generally ions of a heavy, inert gas such as argon and are accelerated to high velocities in directions that are substantially perpendicular to an exposed front surface of the target.

For industrially acceptable sputtering rates, it is important to produce a relatively high density of ionized bombarding particles. The most cost-effective source of ions is low pressure glow discharge. In electrically biased glow discharge sputtering devices, the wafer is mounted on a pedestal that is biased as the sputtering reactor anode or separate anode and the target is biased as the sputtering reactor cathode. This produces at the target an electric field that is substantially perpendicular to the exposed front surface of the target and that accelerates the ions into the exposed surface of the target along trajectories that are substantially perpendicular to the front surface of the target.

Collisions between neutral particles and high energy electrons and ions ionizes some of these neutral particles to replace the ions that bombard the target. This ionization produces within the reactor chamber a conductive plasma body that is separated from the cathode and anode by free-electron deficient regions called plasma sheaths. Because the plasma body is conductive, the accelerating electric fields are substantially restricted to the plasma sheath regions at the wafer and target.

In a planar magnetron sputtering device, ion densities at the target are enhanced by producing within the target sheath a magnetic field that helps trap and direct electrons near the target. The increased electron density in these traps increases the rate of ion generation within these regions, thereby increasing the ion density at the target. Because the electric field $\vec{E}$ within the target sheath is substantially perpendicular to the exposed surface of the target, in those regions where the magnetic field $\vec{B}$ is substantially parallel to the target surface, the $\vec{E} \times \vec{B}$ drift field pushes electrons parallel to the surface of the target. The electrons are trapped by configuring the magnetic fields so that these regions in which the $\vec{E} \times \vec{B}$ drift field is parallel to the target surface form closed paths within which the electrons are then trapped. This configuration of the drift fields is achieved by cooperative selection of the locations and shapes of magnetic fields.

Typically, the target material is attached to a backing plate to mount the target within the reactor. It is important that sputtering of the target does not reach this backing plate because particles sputtered from the backing plate would contaminate the integrated circuit fabrication process. Therefore, a target is typically replaced before sputtering of the backing plate can possibly happen. Unfortunately, this results in the replacement of targets that still contain a significant fraction of the original target material.

Because many targets are composed of an expensive material, such as gold, and because of the significant expense of lost production time to replace a target, it is important to maximize the amount of sputtering that is allowed before the target must be replaced. In German Offenlegungsschrift 27 07 144 entitled *Kathodenzerstaeubungsvorrichtung* filed by Sloan Technology Corp on Feb. 18, 1977, magnet/magnetic pole assemblies are swept either longitudinally in x- and y- directions or off-axis pole assemblies are swept radially about a rotation axis to produce a pattern of target sputter that has an increased time-averaged uniformity of sputter.

In U.S. Pat. No. 4,444,643 entitled *Planar Magnetron Sputtering Device* issued to Charles B. Garrett on Apr. 24, 1984, a movable magnetic field source is moved parallel to the face of the target to produce a time-averaged sputtering of the target that has increased uniformity over the target, thereby increasing the number of wafers that can be processed through use of a single target.

In U.S. Pat. No. 4,714,536 entitled *Planar Magnetron Sputtering Device With Combined Circumferential And Radial Movement of Magnetic Fields* issued to Kenneth F. Freeman et al on Dec. 22, 1987, it is asserted that, in such prior devices, a fixed point on the magnet assembly always rotates over a given radial position on the target, so that circular grooves tend to be formed. To produce a more uniform sputter of the target, the magnetic field is moved in and out radially as it is rotated off-axis about the center of the target.

Figure 1A:
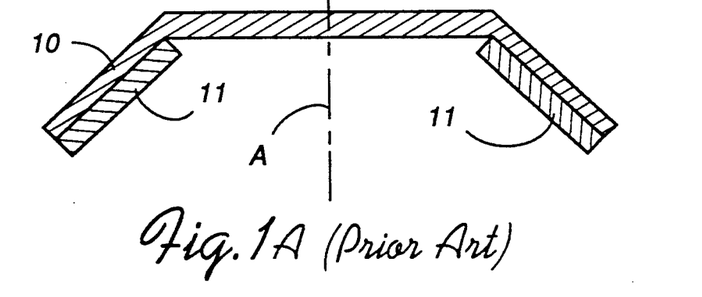
FIGS. 1A and 1B illustrate the CONMAG I and CONMAG II systems, respectively, from Varian Associates, that includes a conical target to improve coating uniformity and step coverage.
Figure 1B:
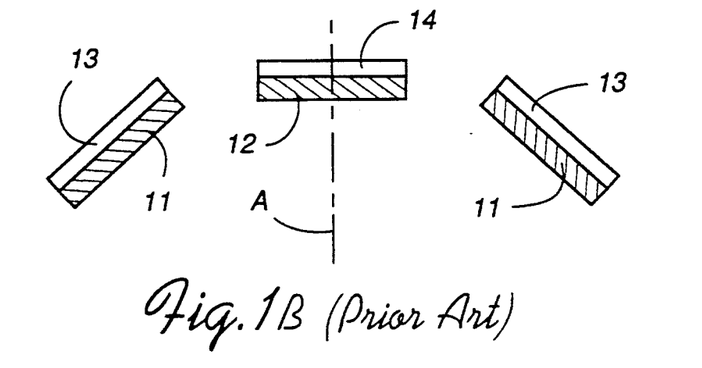

FIGS. 1A and 1B illustrate the CONMAG I and CONMAG II systems, respectively, from Varian Associates which each includes on a metal support 10 a conical target 11 to improve step coverage and uniformity. A single power supply is connected between support 10 and the wafer pedestal. In the CONMAG II embodiment, a second target 12 is included that is centered on and perpendicular to the axis A of conical target 11. There is no rotation of either of these targets. Each of these two targets is mounted on a separate metal support 13 and separate power supplies are provided to each of these two metal supports so that two plasma regions can be produced. In the CONMAG II embodiment, the insertion of the second target 12 requires that the spacing between targets 11 and 12 be nonoptimal, so that the uniformity of coating from these two targets is reduced.

Figure 2:
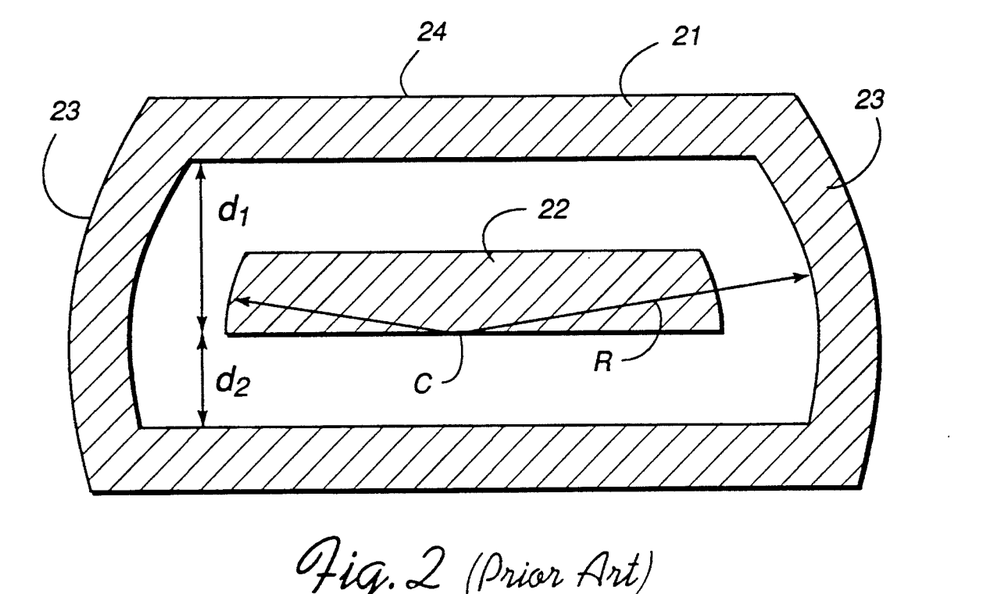
FIG. 2 illustrates a sputtering system by Anelva, in which a wide single groove is produced in the target by means of a pair of magnetic arrays that are rotated about center point C.

In a 1000 Series sputtering system by Anelva, a wide single groove is produced in the target by means of a pair of magnetic arrays 21 and 22 having the shapes indicated in FIG. 2. The sides 23 of the outer magnetic array 21 have a radius of curvature r centered on a point C. The top side 24 and the bottom side 25 are straight and are separated from point C by distances $d_1$ and $d_2$, respectively. The inner magnetic array 22 has a perimeter having substantially the same shape as the outer magnetic array. The magnetic field is produced by these two sets of magnetic arrays.

There are a number of problems with the above references. In U.S. Pat. No. 4,714,536, the gears that generate the combined rotational and radial movement are located in the cooling water for this target. Because of the lack of lubrication of these gears, these gears corrode quickly, requiring very frequent replacement. Also, the plasma sheath is relatively short so that at any given moment there is sputter deposition on only a small portion of the substrate.

In German Offenlegungsschrift 27 07 144, in U.S. Pat. No. 4,444,643, and in U.S. Pat. No. 4,714,536, the efficiency of target utilization is increased, but without any concern for the effect on the quality of sputtered coating produced on the wafer. Especially in submicron integrated circuit fabrication, it is very important to produce layers having uniform thickness and excellent step coverage. When a layer is patterned, if portions of the layer are thicker than other portions, then each of these portions will achieve pattern completion at different times. If some regions are over-etched to achieve etch completion in other regions, then linewidths in the over-etched regions will be reduced below designed values. The layer uniformity and step coverage of these systems are therefore inadequate for most sputtering applications in current state of the art circuits. Thickness variations on the order of 25% can result in these sputtered layers, making these processes suitable substantially only for deposition of the back ground plane of the wafer.

Uniform coatings are also important for preserving accurate mask alignment. The alignment marks typically consist of raised features on a wafer so that they remain visible even after deposition of several layers on the wafer. Asymmetric coating at alignment marks can produce spurious results in the apparent location of these marks, thereby misaligning subsequent patterning.

In the Anelva sputtering system, good layer thickness uniformity (on the order of 3% variation in thickness) can be achieved by positioning the target at a greater distance (on the order of 80 mm) from the wafer than is typical (i.e., on the order of 40–50 mm). Unfortunately, at this spacing, this system produces poor step coverage because there is not enough deposition from wide angle incident sputtered particles.

SUMMARY OF THE INVENTION

In accordance with the illustrated preferred embodiment, a magnetron sputtering system is presented in which the shape of the pole piece improves coating uniformity, step coverage and step coverage uniformity. The shape of this pole piece is motivated by an analysis of the angular distribution of sputtered particles as they leave the target and an analysis of the distribution of sputtered particles needed to produce uniform coatings, excellent step coverage and excellent step coverage uniformity.

Figure 3:
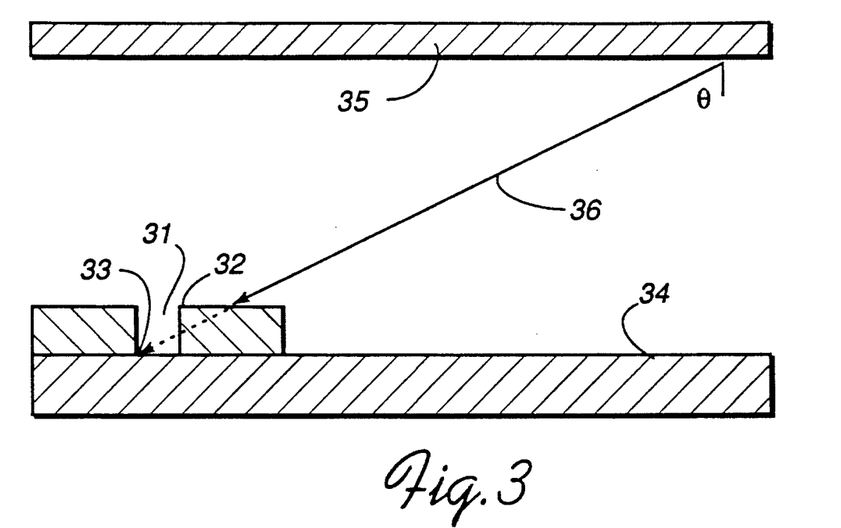
FIG. 3 illustrates shadowing that can occur for highly oblique incident particles.

As is illustrated in FIG. 3, if incident particles arrive at a hole 31 at too oblique an angle $\theta$, then the top corner 32 of one sidewall of a hole can shadow the base 33 of the opposite sidewall of the hole. Thus, for a hole of width W and depth D, only the particles arriving from angles $\theta$ in the range from zero to arctan W/D are effective in producing a coating on the left sidewall. Similarly, only the particles arriving from angles $\theta$ in the range from arctan W/D to zero are effective in producing a coating on the right sidewall. Excellent step coverage requires that, over the entire wafer, there is a sufficient flux of particles from both sides of a hole, trench or line that both sides of such feature will be coated. Excellent step coverage uniformity requires that, throughout the wafer, there is approximately the same flux from each side of every hole, trench and line.

Figure 4:
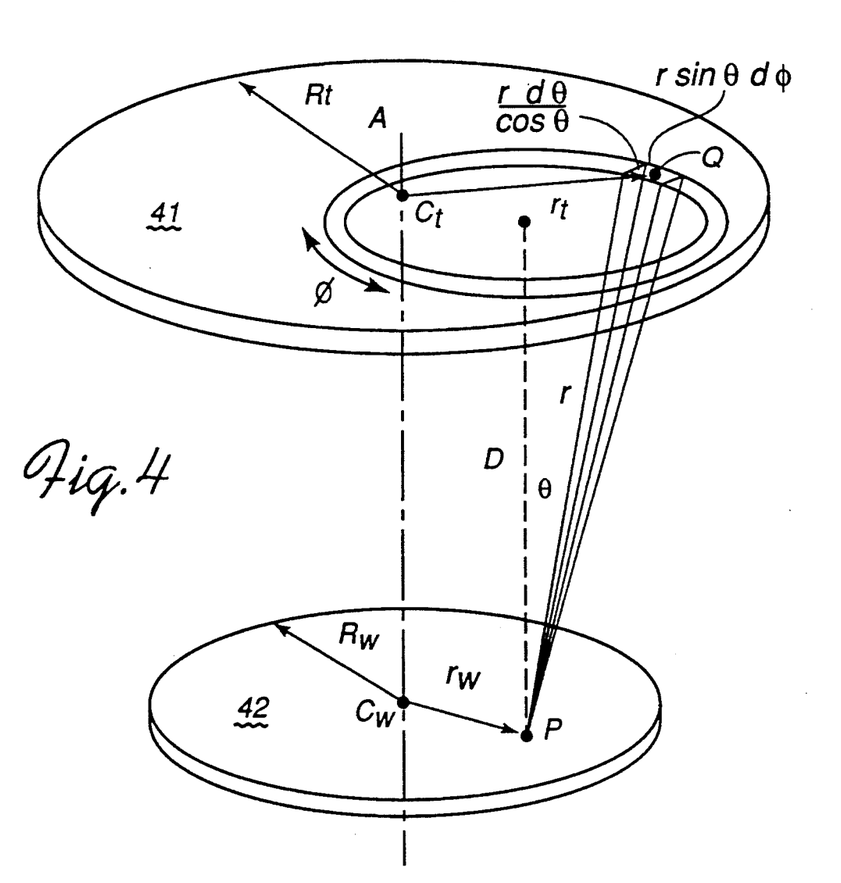
FIG. 4 illustrates the factors that determine the angular distribution of sputtered particles onto a water.

In physical sputtering (as opposed to chemical sputtering) it is theorized that the incident bombarding particles produce within the target a collisional cascade having a statistical distribution of momenta directions. This statistical process ejects target particles in random directions so that there is a substantially constant angular distribution of ejection of particles from the target. Therefore, as illustrated in FIG. 4, at a point P of the wafer, the intensity $I(P,\theta,\phi)$ of particles incident within a solid angle $d\theta d\phi$ centered at the angular polar coordinates $\theta,\phi$ is equal to the product of the following factors: (1) the area $r^2 \cdot \tan\theta \cdot d\theta d\phi$ of the portion of the target within the angular ranges $d\theta$ and $d\phi$; (2) the $r^{-2}$ factor of decrease in intensity for a spherically symmetric distribution of flux; (3) the $\cos(\theta)$ projection factor to account for the angle $\theta$ between the normal to the wafer and the incident flux vector for these particles; and (4) the rate S of sputtering from this infinitesimal area of the target. Thus, the intensity of particles incident on point P, within this solid angle, is:

$$I(P,\theta,\phi,) = S(Q) \cdot \sin\theta \cdot d\theta d\phi \qquad (1)$$

where Q is the point on the target from which the sputtering produces these incident particles.

Figure 5:
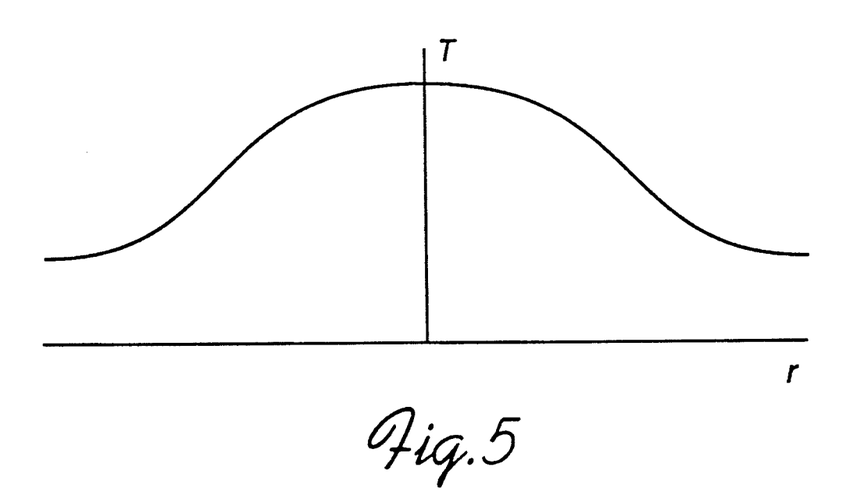
FIG. 5 illustrates the radial distribution of sputter-deposited particles on a wafer when the target is substantially uniformly sputtered.

When $S(Q)$ is substantially constant, as is the objective of those prior art patents discussed above that seek to maximize the use of the target, this flux at point P is just the solid angle subtended at point P of the wafer by this infinitesimal area of the target. Therefore, for these devices, the total intensity $I(P) = \int I(P,\theta,\phi) d\theta d\phi$ of particles on a point P of the wafer is equal to the solid angle subtended at point P by the target. In general, the wafer is centered under and is parallel to the target so that the maximum subtended solid angle occurs when point P is located at the center of the wafer. Therefore, these prior sputtering systems produce a coating thickness that is definitely not uniform over the wafer. Because of the axial symmetry of the wafer/target system, the thickness T is a function only of the radial distance $\rho$ of point P from the center of the target and has the shape illustrated in FIG. 5.

Because the target has a finite radius $R_t$, for any given angle $\phi$ about the vertical line through point P, there is a maximum value of azimuthal angle $\theta$ for which the flux is nonzero. For larger values of $\theta$, the cone of solid angle $d\theta d\phi$ in the direction $\theta,\phi$ does not intersect the target so that no particles can be sputtered from this direction. Therefore, the angular distribution of particles at a point P is a function of the distnace of point P from axis A, the radius $R_t$ of the target, the radius $R_w$ of the wafer, the distance D between the wafer and the target, and the sputtering intensity distribution within the target. For a spatially uniform sputter rate from the target, the rate of sputtering onto point P from the direction of axis A will increase with the distance of point P from axis A and the rate of sputtering from the direction of the closest point on the perimeter of the target will decrease with the distance of point P from axis A. Therefore, prior systems that produce uniform sputtering of the target will have poor step coverage uniformity.

Figure 6:
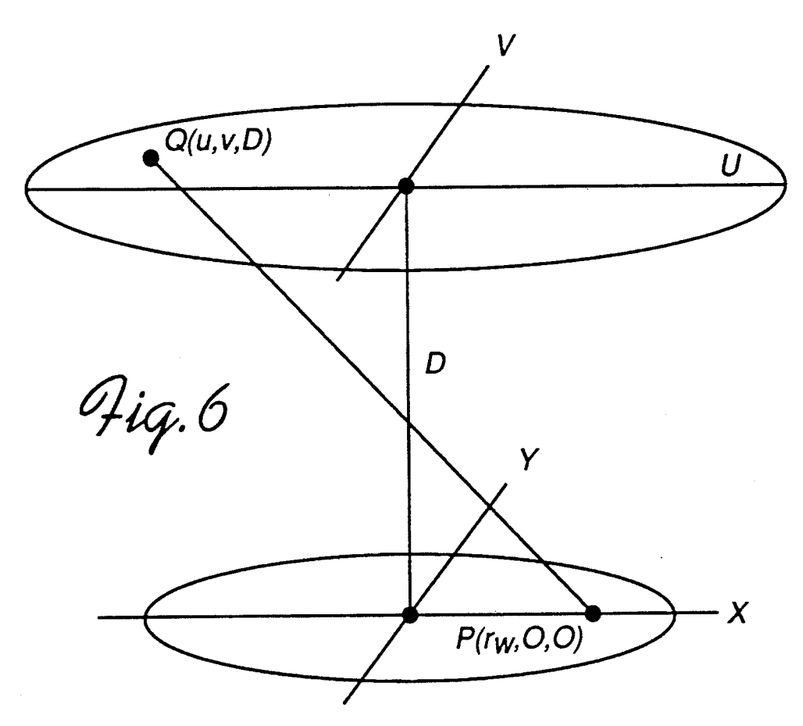
FIG. 6 illustrates the calculation of the total flux at a point of the wafer at a radius $\rho_w$.

Because of the axial symmetry of the system about an axis A that passes through the centers $C_t$ of the target and $C_w$ of the wafer, the deposited intensity $I(P,\theta,\phi)$ will retain axial symmetry only if S is a function only of the radial distance $\rho_t$ from the center $C_t$ of the target. That is, $S=S(\rho_t)$ and is zero for $\rho_t$ greater than the radius $R_t$ of the target. For this choice, at the point P located at the radial distance $\rho_w$ from the center of the wafer, the total intensity I(P) is independent of the angular position $\phi_w$ of point P and is therefore a function only of $\rho_w$. Mathematically, $I(\rho_w)$ is the integral over all $\theta$ and $\phi$, where, for each value of $\theta$ and $\phi$, point Q is located to produce incident particles in this direction. Because of the rotational symmetry, this can be evaluated for the special case of a point on the wafer at $x=\rho_w$ and $y=0$, as illustrated in FIG. 6:

$$I(\rho_w) = \int_T [S(\{u^2 + v^2\}^{\frac{1}{2}}) \cdot D \cdot \{(\rho_w - u)^2 + v^2 + D^2\}^{-3/2}] du dv \quad (2)$$

where D is the spacing between the wafer and the target, $$\int_T$$

represents the integral over the (u,v) range within the target, and $S(\{u^2+v^2\}^{\frac{1}{2}})$ is zero for $\{u^2+v^2\}^{\frac{1}{2}}$ greater than the target radius $R_t$. The integrand is the product of the sputtering intensity distribution (i.e., the distribution of the rate of sputtering particles from the target) at point (u,v,D), the cosine of the angle between the normal to the wafer and the vector connecting points (u,v,D) and ($\rho_w$,0,0), and the $r^{-2}$ factor characteristic of a spherically symmetric flux.

Figure 7:
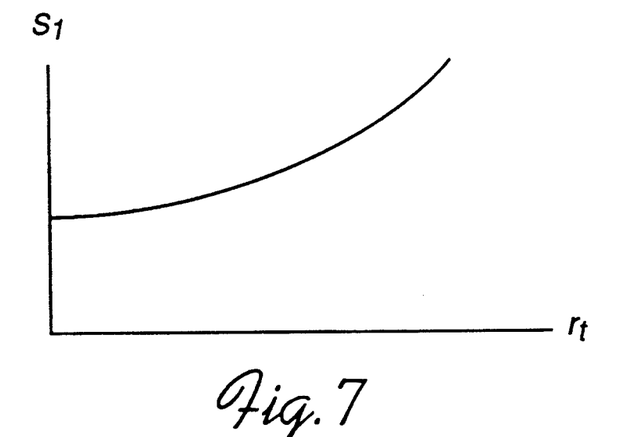
FIG. 7 illustrates the ideal radial dependence on sputter intensity needed to achieve a substantially uniform sputtered coating thickness.

To produce a substantially uniform coating thickness on the wafer, $S(\rho_t)$ must have the ideal functional dependence $S_f(\rho_t)$ as illustrated in FIG. 7. This sputtering profile can be approximated by etching in the target a set of N axially symmetric grooves, where the kth groove produces a sputtering intensity distribution $S_k(\rho_t)$ and the total actual sputtering rate $S_a(\rho_t)$ is:

$$S_a(\rho_t) = \sum_{k=1}^{N} S_k(\rho_t) \quad (3)$$

Figure 8A:
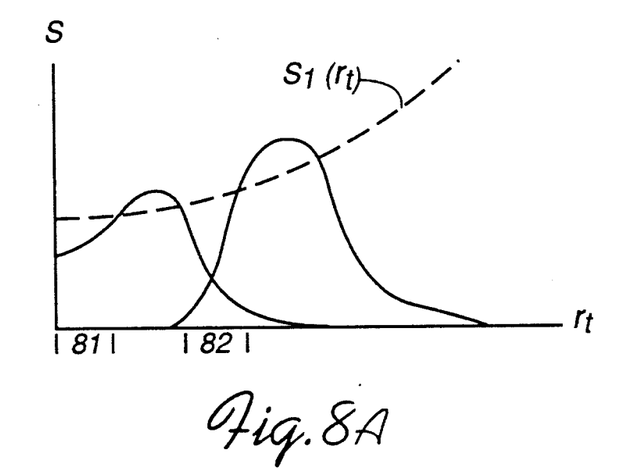
FIGS. 8A and 8B illustrate the approximation of the ideal radial dependence of sputtering achieved by sputtering grooves of controlled depth, width and location.
Figure 8B:
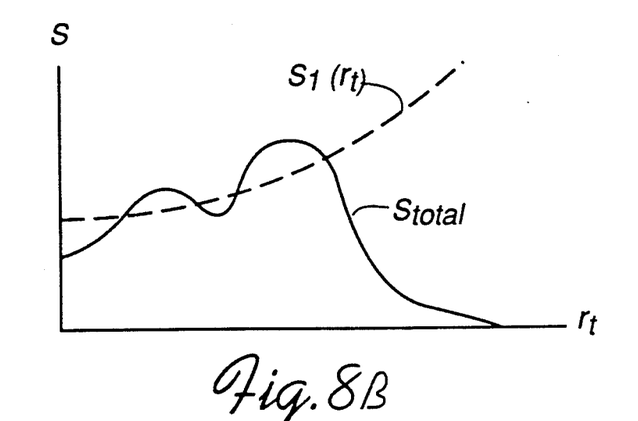

This is illustrated graphically in FIGS. 8A and 8B for the case N=2.

Figure 9A:
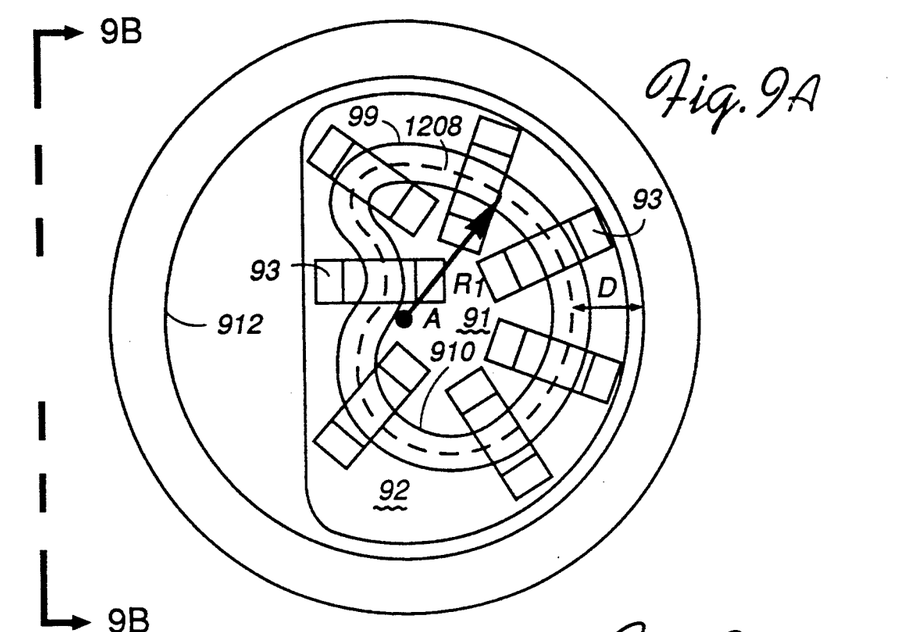
FIG. 9A is a top cross-section view, taken substantially along the line 9A—9A of FIG. 9B, of a magnetron assembly having pole pieces that produce highly uniform sputtered coating thickness and excellent step coverage and step coverage uniformity.

The formation of selected grooves in the target is achieved by means of a specially designed magnetron source having pole pieces that produce the sputtering intensity $S_a(\rho_t)$. Pole pieces that achieve this actual sputtering profile for N=2 are illustrated in FIG. 9A. This design is easily adapted for other values of N.

This design utilizes the facts that, in a magnetron sputtering system, the majority of sputtering occurs where the magnetic field is approximately parallel to the target and that the regions where this occurs must form closed paths within which electrons can be trapped to enhance ion generation and the associated local sputtering rate. The pole pieces and magnets are rotated about a central axis A of the target to produce a circularly symmetric sputtered pattern of grooves in the target.

The regions where the magnetic field is substantially parallel to the target occur along a track between the two pole pieces. The pole pieces are designed so that this track consists of three regions: (1) a first approximately circular arc of radius $R_1$ centered on axis A; (2) a second approximately circular arc of radius $R_2$ centered on axis A; and (3) two sections that couple the first and second arcs to form a closed path. At axis A, the first arc subtends an angle $\alpha_1$ and the second arc subtends an angle $\alpha_2$. As these pole pieces are rotated about axis A, 2 grooves of radius $R_1$ and $R_2$ are produced having a relative depth of $\alpha_1/\alpha_2$. The sections of the track that connect these two arcs produce sputtering of the region between these two grooves, thereby flattening the sputtered region between these two grooves. The arc lengths and radii of the first and second sections of the track are selected to optimize the flatness of coating thickness sputtered from the target onto a wafer.

Excellent step coverage requires adequate thickness of coverage over the entire step and sufficient sputtering onto both sidewalls of a line, trough or hole that both sidewalls are adequately coated. Excellent step coverage uniformity requires substantial equality of coverage of both upward and downward steps so that asymmetric coverage of a step does not result. Asymmetric coverage of alignment marks can produce misalignment of subsequent layers. Asymmetric coverage of underlying features can produce misalignment of those features with features in subsequent layers. The increasing monotonic form of the sputtering rate $S(\rho_t)$ increases the fraction of obliquely incident particles incident on point P in directions toward the center of the wafer, thereby improving step coverage uniformity. The uniformity of step coverage is also a function of the ratio $R_t/R_w$. This ratio and the sputtering rate $S(\rho_t)$ can be selected to achieve excellent step coverage uniformity and excellent coating thickness uniformity.

Because the rotation axis A is within the boundaries of these poles, the area covered by these poles at any given instant is a substantial fraction of the area of the target. This produces a much greater sputtering rate than is produced by the systems of U.S. Pat. No. 4,714,536 and German Offenlegungsschrift 27 07 144 in which sputtering occurs from only a small fraction of the target at any given instant. Because there is a single trap region track produced, there is no instability as to which of multiple possible plasma regions actually produce a plasma, as is the case in CONMAG II discussed above. Thus, this single trap region avoids the need for multiple power sources as in CONMAG II discussed above.

These and other objectives and advantages of the present invention will become clear from the detailed description given below in which a preferred embodiment is described in relation to the drawings. The detailed description is presented to illustrate the present invention, but is not intended to limit it.

BRIEF DESCRIPTION OF THE FIGURES

In the figures, the first digit of a reference numeral indicates the first figure in which is presented the element indicated by that reference numeral.

DESCRIPTION OF THE PREFERRED EMBODIMENT

Figure 9B:
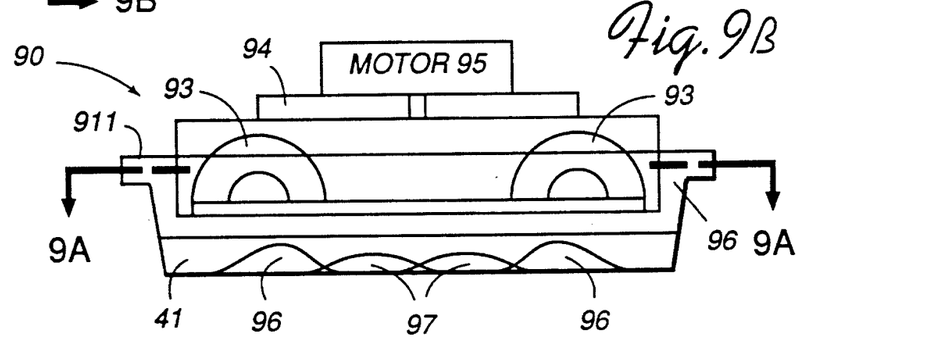
FIG. 9B is a side cross-sectional view, taken substantially along the line 9B—9B of FIG. 9A, of the magnetron assembly of FIG. 9A.

FIGS. 9A and 9B illustrate top and side views of a magnetron assembly 90 having ferromagnetic pole pieces 91 and 92 that enable the production of sputtered coatings having uniform thickness, excellent step coverage and excellent step coverage uniformity. This magnetron assembly is utilized in a sputtering system such as the system consisting of the chamber of FIG. 10 and the lid of FIGS. 9A and 9B.

Figure 10:
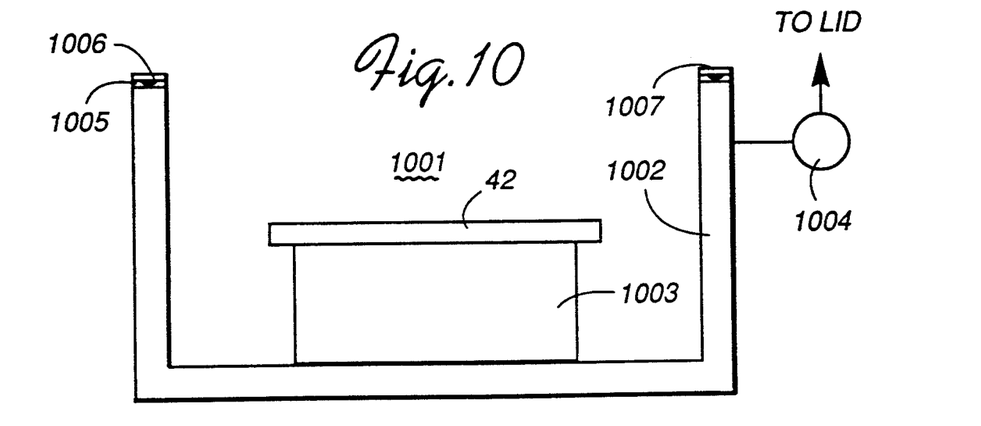
FIG. 10 illustrates a sputtering system utilizing the magnetron assembly of FIGS. 9A and 9B, wherein the vacuum chamber is shown in juxtaposition with the magnetron assembly of FIG. 9B, which serves as a lid of the chamber.

A typical sputtering system includes a vacuum chamber 1001 within which a high vacuum is produced. Chamber 1001 is typically enclosed by sidewalls 1002 and magnetron assembly 90 that also functions as the lid 911 for the vacuum chamber. The sidewalls are often formed of a metal such as stainless steel or aluminum. Attached to the underside of the lid is a target 41 formed of a material that is to be sputtered onto a wafer 42. In the bottom of chamber 1001 is a pedestal 1003 on which the wafer is placed during processing. A voltage source 1004 produces a dc or rf potential difference between walls 1002 and lid 911 to accelerate ions into the target to sputter target particles onto the wafer. A metal ring 1005 is welded to the top of the sidewalls and includes a groove in which is inserted a rubber O-ring 1006. This O-ring forms a vacuum seal between metal ring 1005 and a ring 1007 formed of a nonconductive material such as teflon or a ceramic. Nonconductive ring 1007 enables the voltage difference to be produced between sidewalls 1002 and lid 90. Because of the heat generated by the impact of high energy ions on the target, a coolant system, such as water-cooled chamber 94 (also serving as a mount for motor 95), is thermally connected to the target. To enhance cooling of the target, the lid is formed of a highly heat-conductive material such as copper.

In magnetron sputtering systems, a magnetic field is produced within chamber 1001 adjacent to target 41 to increase the generation of ions near the target by trapping electrons near the target. These electron traps typically consist of one or more closed loop regions within which the magnetic field is substantially parallel to the target. In these regions, the electric field and magnetic field are substantially perpendicular and produce an $\vec{E}\times\vec{B}$ drift field that pushes electrons parallel to the surface of the target. Because these regions form closed loops, the electrons become trapped near the target, thereby functioning effectively to produce ions that impact the target. In the sputtering system, magnetron assembly 90 produces these electron trap regions.

As is illustrated in FIGS. 9A and 9B, magnetron assembly 90 includes pole pieces 91 and 92, magnets 93, lid 911, target 41, and a water-cooled motor mount 94 that couples pole pieces 91 and 92 and associated magnets 93 to a motor 95. All of the magnets 93 have the same polarity magnetic pole overlying pole piece 91. Although electromagnets can be used to produce a magnetic field between the pole pieces, permanent magnets are preferred because of their greater field strength.

Figure 12:
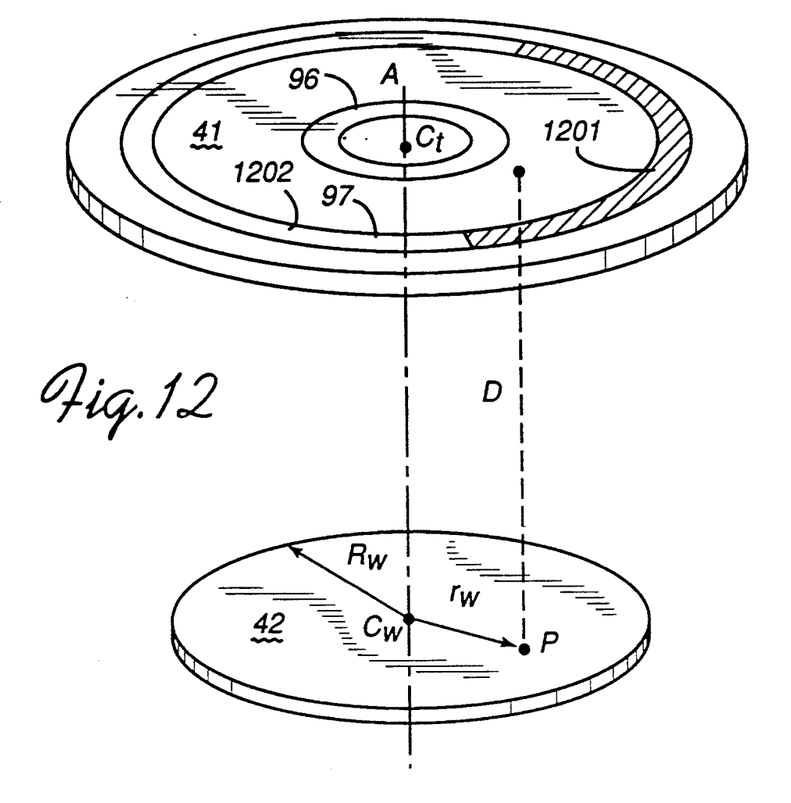
FIG. 12 illustrates the portion of groove 97 that produces a radially inward flux of particles on point P of the wafer.

Motor 95 rotates pole pieces 91 and 92 and magnets 93 about an axis A centered over wafer pedestal 1003 to produce a time averaged sputtering that is circularly symmetric. As will be discussed in greater detail below, this rotation produces in target 41 circular sputtered grooves 96 and 97 that are centered on axis A. The width, depth and spacing of these grooves relative to axis A are chosen to produce very uniform coating thicknesses on wafer 42. Because groove 97 produces a large number of oblique ions onto the entire target and these ions have all possible lateral components (i.e., all possible vector components parallel to wafer 42), excellent step coverage results throughout the wafer for all orientations of steps. As seen from FIG. 12, the portion 1201 of groove 97 produces a flux of ions having a radial component inward toward axis A. The portion 1202 of groove 97 and all of groove 96 produce a flux of ions having a radial component outward from axis A. Because portion 1201 of groove 97 is deeper and longer than groove 96, and is closer to points P than most of groove 96 and most of portion 1202, the flux from portion 1201 can be as large as from these other two sources. The radii of groove 96, groove 97, wafer 42 and target 41 are chosen in conjunction with the widths and depths of these grooves to produce substantially constant layer thickness and step coating uniformity over the entire wafer. A pair of pole pieces that achieve this are illustrated in FIG. 9A.

Figures 11A, 11B, 11C:
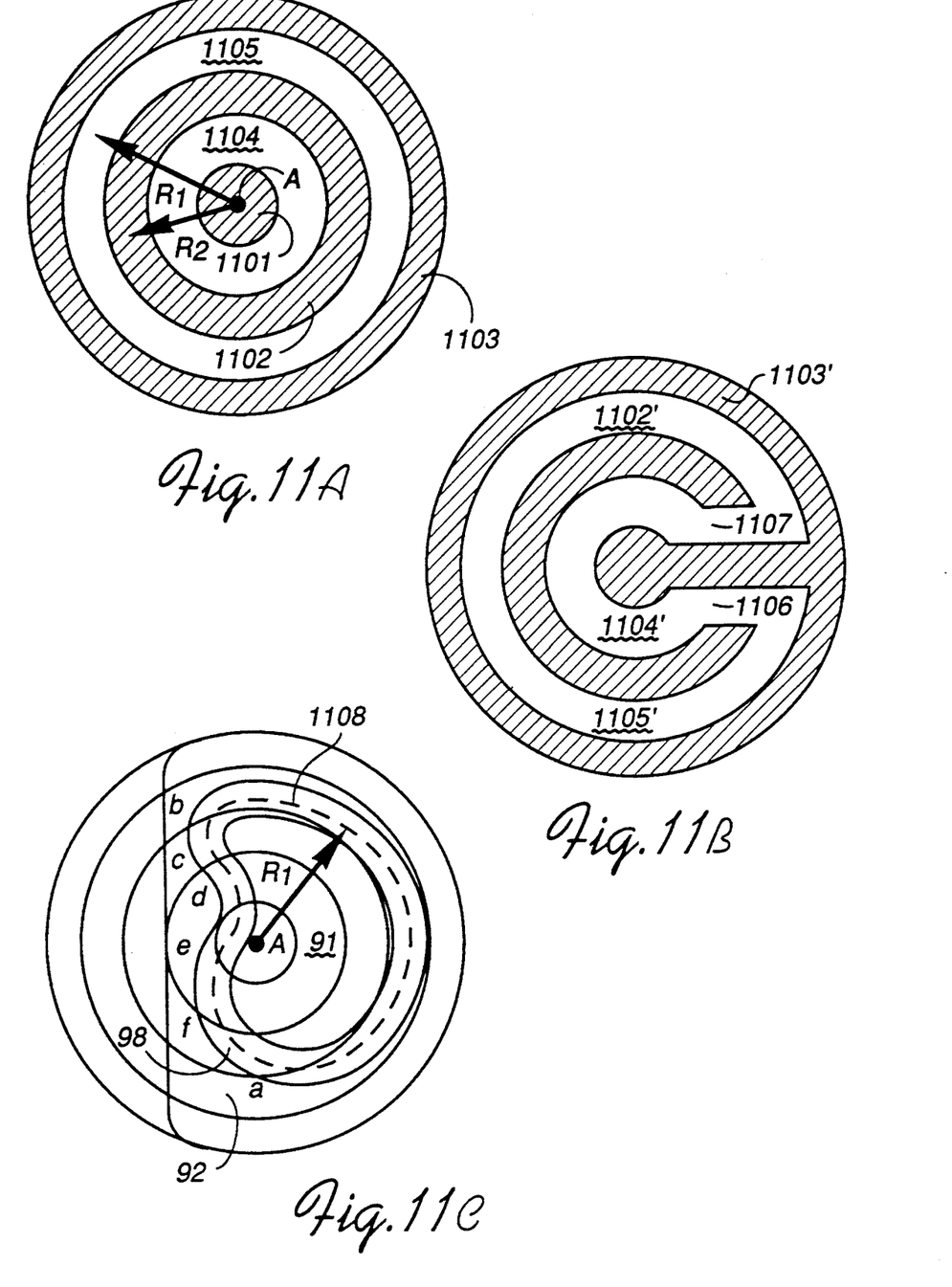
FIGS. 11A–11C illustrate the evolution from a two track sputtering system to that of FIGS. 9A and 9B.

FIGS. 11A–11C illustrate steps utilized in deriving the pole piece shapes of FIG. 9A. FIG. 11A illustrates a set of three ferromagnetic pole pieces 1101–1103 that produce two gap regions 1104 and 1105 of radii $R_1$ and $R_2$, respectively. Within a band centered in each of these gap regions, the magnetic field will be substantially parallel to target 41 so that each of these regions can function as an electron trap. However, because of the nonlinearity of the plasma process, a plasma generally will result in only one of these tracks. To avoid this, the pole pieces are reshaped to form a single track that includes a portion 1104' of the arc at radius $R_1$, a portion 1105' of the arc at radius $R_2$ and a pair of radial sections 1106 and 1107 that connect these two arcs to form a closed path. The set of pole pieces now consist of a C-shaped pole piece 1102' and a pole piece 1103' that includes circular pole piece 1101, annular pole piece 1103 and a radial segment connecting these two prior pole pieces.

Empirical variation of pole pieces 1102' and 1103' resulted in pole pieces 91 and 92 of FIG. 9. Pole piece 91 is kidney shaped and pole piece 92 has an inner edge 99 that is substantially parallel to an outer edge 910 of pole piece 91 so that gap 98 is substantially constant. The constant gap makes the magnetic field substantially constant throughout the length of a track 1108, thereby reducing the tendency of the plasma to form only near a portion of the gap between pole pieces 1102' and 1103'.

FIG. 11C compares the pole piece sets of FIGS. 9A and 11A to illustrate that pole pieces 91 and 92 produce a gap 98 that includes portions that are substantially at distances $R_1$ and $R_2$, respectively, from rotation axis A. The portion of gap 98 from point a to point b is substantially the same as about 50% of gap 1105 and sputters from the target an annular groove of radius $R_2$. If this portion is slightly off center from rotation axis A, by a distance $\delta$ that is much smaller than $R_1$ it has the effect of widening the groove etched into the target. The width of the groove is also affected by the width of gap 1105. The depth of the groove can be varied by altering the magnitude that this arc subtends at axis A.

The portions of gap 98 from point c to point d and from point e to point f are substantially the same as about 15% of gap 1104. The portions of gap 98 from point b to point c and from point f to point a produce sputtering of the target annular region directly under pole piece 1102 of FIG. 11A. The portion of gap 98 from point d to point e produces sputtering of the circular region covered by pole piece 1101 of FIG. 11A.

The electrons are trapped within a track (represented by dashed line 1108 in FIG. 11) that is located within gap 98. The width of gap 98 is substantially constant so that the electron trapping properties are substantially constant around the entire electron trap region. In FIG. 9A it can be seen that gap 98 covers rotation axis A so that sputtering of the target occurs at the center of the target as well. This increases the sputtering intensity in regions 81 and 82 of FIGS. 8A and 8B, producing a sputtering distribution substantially equal to $S_f(\rho_t)$. It is important to provide at least some sputtering at all points of the target to avoid the formation of thin backsputtered regions that flake off and produce particulates that can deposit on the wafer.

Figure 13:
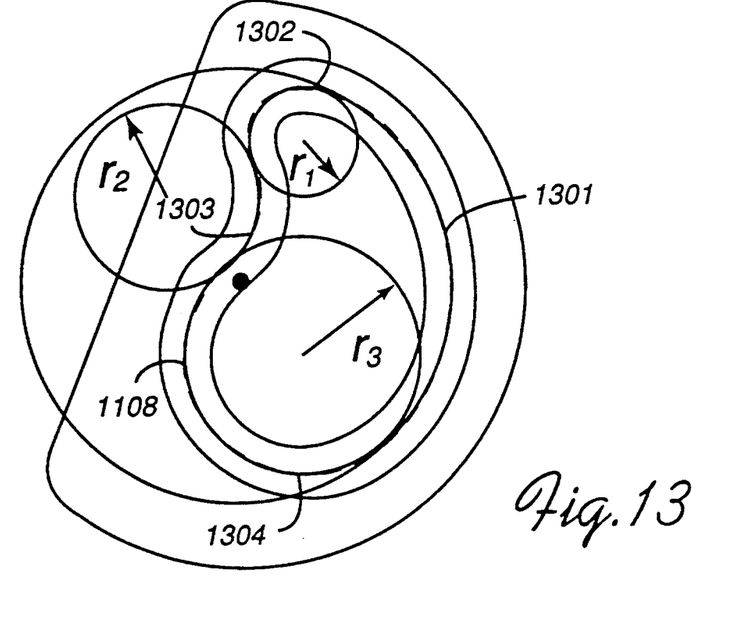
FIG. 13 illustrates a particular embodiment of the pole pieces in which the track is formed by milling a metal sheet with a constant width closed cut consisting of four circular arcs.

The particular embodiment of FIGS. 9A and 11C has a gap formed from four sections 1301–1304 (shown in FIG. 13), each of which is an arc of a circle. This results in an easily manufacturable gap that can be cut by a programmable machine tool programmed to sequentially mill into a sheet of ferromagnetic material the four successive circular arcs of radii $R_1$, $r_1$, $r_2$ and $r_3$, where $R_1$ is the same as shown in FIG. 9A. This produces a constant width gap and produces both edges 99 and 910. The radii $r_1$, $r_2$ and $r_3$ and the respective arclengths of these arcs are chosen so that the portion of track 1108 between points d and e is substantially at the distance $R_2$ (as shown in FIG. 11A) from rotation axis A. Radius $r_1$ is chosen smaller than $r_3$ to produce the portion of track 1108 from point b to point c to sputter the lower portion of region 82. Similarly, radius $r_2$ is chosen to produce the portion of track 1108 from point f to point a such that it produces additional sputtering of the upper portion of region 82.

The uniformity of the coating thickness is measured as the variability in thickness as a fraction of the average thickness. The parameters of the pole pieces are selected to minimize this fractional change in thickness. The step coverage is measured as follows. At a hole or trench, the minimum thickness of coating is measured at the top edge of each of a pair of opposite side walls. The ratio of these two thicknesses is the measure of the step coverage of that hole or trench. The step coverage uniformity is measured as the variability of this ratio as a fraction of the average value of this ratio.

A plot of the fraction of trap region that is located at a distance $\rho_t$ from rotation axis A is substantially equal to $S_f(\rho_t)$ so that, when the pole pieces are rotated about axis A, a circularly symmetric sputter pattern is produced that is substantially equal to $S_f(\rho_t)$. Equivalently, the centerline of the gap is represented mathematically by an angular function $\theta(r)$ of the radial distance r of the centerline from axis A that has two monotonic sections whose sum is equal to the fraction of trap region that is located at a distance r from rotation axis A.

Wafer diameters are typically 100, 125, 150 or 200 mm and target diameters range from 250 mm for the 100 mm diameter wafer to 325 mm for the 200 mm diameter wafer. The spacing D between the wafer and target is typically in the range 35 mm to 55 mm. For the 150 mm diameter wafers, radius $R_1$ in FIG. 11A is 102 mm and radius $R_2$ is 35 mm. The relative depth of sputter in the groove of radius 102 mm is twice that in the groove of radius 35 mm.

I claim:

1. A sputtering system for sputtering particles from a magnetron type target onto a substrate, said sputtering system comprising:
   a vacuum chamber for enclosing said target and substrate;
   a voltage source means for producing an electric field incident the magnetron target to accelerate ions into the target to sputter particles from a sputtering surface of the target; and
   a magnet structure positioned adjacent to another surface of the target, and including
   a ferromagnetic inner pole piece;
   a ferromagnetic outer pole piece that encircles the inner pole piece to form a gap between these two pole pieces;
   magnet means for producing a magnetic field across the gap between these two pole pieces; and
   motor means for rotating these pole pieces at a common rotation rate about an axis A that is substantially perpendicular to said pole pieces and on which said wafer is to be centered perpendicular to this axis; said gap having the shape of a closed loop for which the fraction of gap at each radial distance $\rho_t$ from axis A is substantially equal to a distribution $S_f(\rho_t)$ that produces a uniform thickness of sputtered particles on said substrate.

2. A sputtering system as in claim 1 wherein said gap has a substantially constant width.

3. A sputtering system as in claim 1 wherein said pole pieces have been formed by milling into a sheet of ferromagnetic material a cut of width equal to the width of said gap.

4. A sputtering system as in claim 1 wherein said gap intersects said rotation axis A, whereby the center of the target is significantly sputtered.

5. A sputtering system as in claim 1 wherein the shape of said gap consists of a set of four arcs each of substantially constant radius of curvature, connected in series to form a closed path.

6. A sputtering system as in claim 5 wherein a first of said arcs, of radius $R_1$ and arc length L, is substantially centered on axis A; and
the other arcs are within the circle of radius $R_1$ about axis A, whereby a sputtered groove is formed in the target of depth proportional to the arc length of said first arc.

7. A sputtering system as in claim 5, wherein:
each of the four arcs has an associated radius of curvature and these four radii are selected to optimize the uniformity of deposition of a sputtered coating on the substrate.

8. A sputtering system as in claim 1 wherein the shape of said gap consists of a plurality of arcs, each having a constant radius of curvature, connected in series to form a closed path.

9. A sputtering system as in claim 8 wherein a first of said arcs has a constant radius of curvature $R_1$ and arc length L, is substantially centered on axis A; and
the other arcs are within the circle of radius $R_1$ about axis A, whereby a sputtered groove is formed in the target of depth proportional to the arc length of said first arc.

10. A sputtering system as in claim 9 wherein the first arc has a center point that is offset by a distance $\delta$ that is much smaller than $R_1$, whereby an associated groove formed in the target is approximately $2\delta$ wider than it would be if $\delta$ were zero.

11. A sputtering system as in claim 8, wherein:
each of the arcs has an associated constant radius of curvature and these radii are selected to optimize the uniformity of deposition of a sputtered coating on the substrate.

12. A sputtering system as in claim 1, wherein the target has a radius substantially equal to an optimum target radius which maximizes the uniformity of deposited coating thickness over the substrate.

13. A sputtering system as in claim 1, wherein the target has a radius substantially equal to an optimum target radius which maximizes the uniformity of step coverage over the substrate.

14. A method of sputtering particles from a magnetron-type target onto a surface area of a substrate, comprising the steps of:
producing an electric field to accelerate ions into the target to sputter particles from a sputtering surface of the target;
positioning an inner ferromagnetic pole piece and an outer ferromagnetic pole piece adjacent to another surface of the target, so that the outer pole piece encircles the inner pole piece with a gap between the two pole pieces;
producing a magnetic field across the gap between the pole pieces;
rotating said pole pieces at a common rotation rate about an axis which is substantially perpendicular to, and substantially centered in, said substrate surface area; and
establishing the respective shapes of said two pole pieces so that said gap between them has the shape of a closed loop having a radial distance $\rho_t$ from the axis which varies with angular position about the axis is such a way that the distribution $S_i(\rho_t)$ of such distances $\rho_t$ produces a substantially uniform spatial distribution of sputtered particles over said substrate surface area.

15. A method of sputtering as in claim 14, wherein the establishing step further comprises establishing the respective shapes of the two pole pieces so that said gap has a substantially constant width.

* * * * *